United States Patent
Chen et al.

(10) Patent No.: US 8,476,146 B2
(45) Date of Patent: Jul. 2, 2013

(54) REDUCING WAFER DISTORTION THROUGH A LOW CTE LAYER

(75) Inventors: Chi-Ming Chen, Zhubei (TW);
Chung-Yi Yu, Hsin-Chu (TW);
Chia-Shiung Tsai, Hsin-Chu (TW);
Ho-Yung David Hwang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 12/959,984

(22) Filed: Dec. 3, 2010

(65) Prior Publication Data
US 2012/0138945 A1 Jun. 7, 2012

(51) Int. Cl.
*H01L 21/46* (2006.01)
*H01L 21/76* (2006.01)
*H01L 21/762* (2006.01)

(52) U.S. Cl.
USPC .... 438/455; 438/459; 438/406; 257/E21.567; 257/E21.568; 257/E21.569; 257/E21.57

(58) Field of Classification Search
USPC ............. 438/455, 459, 406; 257/E21.567, 257/E21.568, E21.569, E21.57
See application file for complete search history.

(56) References Cited

U.S. PATENT DOCUMENTS

| | | | | |
|---|---|---|---|---|
| 4,878,957 A * | 11/1989 | Yamaguchi et al. | ......... | 148/33.3 |
| 6,146,979 A * | 11/2000 | Henley et al. | ................. | 438/458 |
| 6,544,656 B1 | 4/2003 | Abe et al. | | |
| 6,664,126 B1 * | 12/2003 | Devoe et al. | .................... | 438/50 |
| 7,112,830 B2 | 9/2006 | Munns | | |
| 7,547,925 B2 | 6/2009 | Wong et al. | | |
| 7,598,108 B2 | 10/2009 | Li et al. | | |
| 2007/0108456 A1 | 5/2007 | Wong et al. | | |
| 2009/0278233 A1* | 11/2009 | Pinnington et al. | ........... | 257/615 |
| 2009/0321747 A1* | 12/2009 | Murphy et al. | ................. | 257/77 |
| 2010/0295083 A1* | 11/2010 | Celler | ............. | 257/98 |

* cited by examiner

*Primary Examiner* — Luan C Thai
(74) *Attorney, Agent, or Firm* — Haynes and Boone, LLP

(57) ABSTRACT

Provided is a method of fabricating a semiconductor device. The method includes forming a first layer on a first side of a first silicon wafer. The first silicon wafer has a second side opposite the first side. The first layer has a coefficient-of-thermal-expansion (CTE) that is lower than that of silicon. The method includes bonding the first wafer to a second silicon wafer in a manner so that the first layer is disposed in between the first and second silicon wafers. The method includes removing a portion of the first silicon wafer from the second side. The method includes forming a second layer over the second side of the first silicon wafer. The second layer has a CTE higher than that of silicon.

20 Claims, 7 Drawing Sheets

REDUCING WAFER DISTORTION THROUGH A LOW CTE LAYER

BACKGROUND

The semiconductor integrated circuit (IC) industry has experienced rapid growth in recent years. Technological advances in IC materials and design have produced various types of ICs that serve different purposes. The fabrication of some types of ICs may require forming a III-V family layer on a substrate, for example forming a gallium nitride layer on a substrate. These types of IC devices may include, as examples, light-emitting diode (LED) devices, radio frequency (RF) devices, and high power semiconductor devices.

Traditionally, manufacturers have formed the III-V family layer on a sapphire substrate. However, sapphire substrates are expensive. Thus, some manufacturers have been attempting to form III-V family layers on a silicon substrate, which is cheaper. However, existing methods of forming a III-V family layer on a silicon substrate may result in wafer bending or distortion, especially if the fabrication involves drastic temperature changes. The wafer distortion may lead to wafer defects, which reduces yield and degrades device performance.

Therefore, while existing methods of forming III-V family layers on silicon substrates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the features are formed in direct contact, and may also include embodiments in which additional features may be formed interposing the features, such that the features may not be in direct contact. Various features may be arbitrarily drawn in different scales for the sake of simplicity and clarity.

Figure 1:
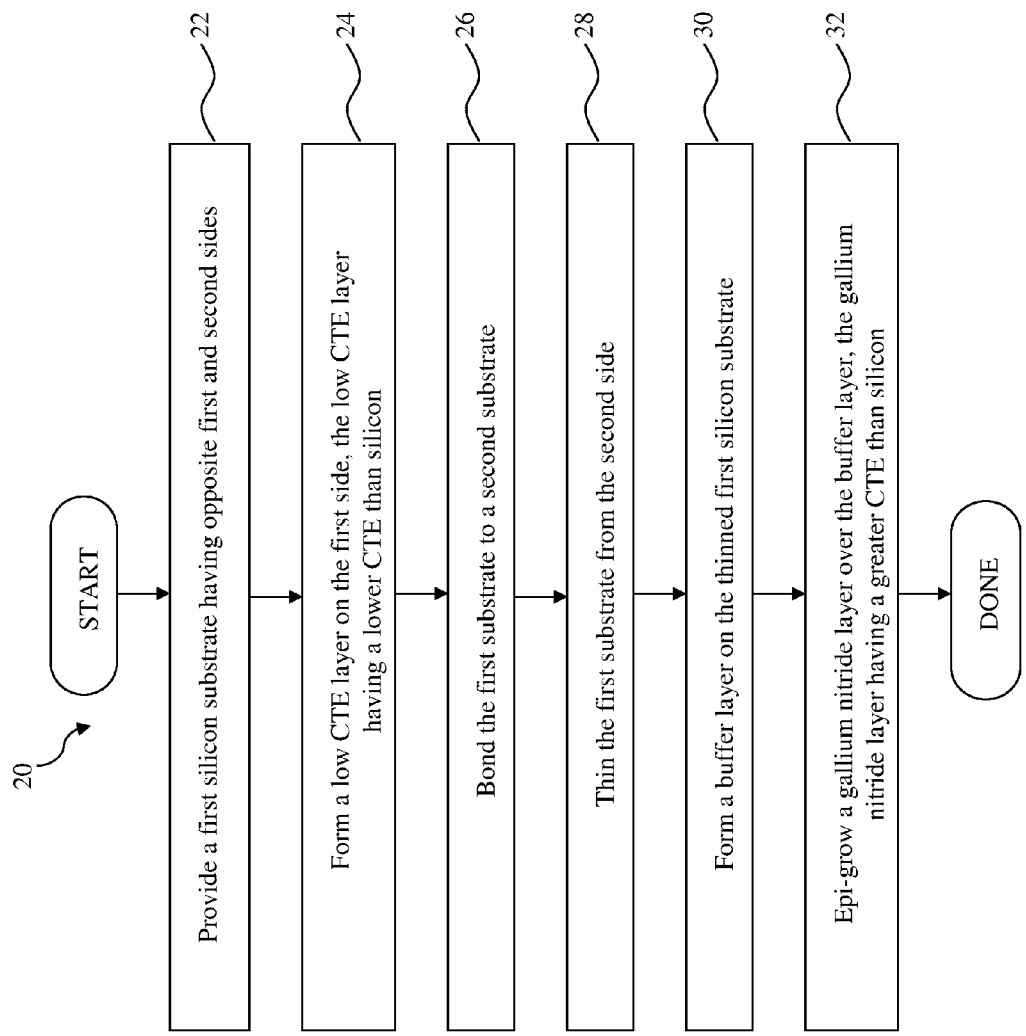
FIG. 1 is a flowchart illustrating a method for fabricating a semiconductor device according to various aspects of the present disclosure.

Illustrated in FIG. 1 is a flowchart of a method 20 for fabricating a semiconductor device according to various aspects of the present disclosure. Referring to FIG. 1, the method 20 begins with block 22, in which a first silicon substrate having opposite first and second sides is provided. The first silicon substrate has a silicon (111) surface. The method 20 continues with block 24, in which a low coefficient-of-thermal-expansion (CTE) layer is formed on the first side of the first silicon substrate. The low CTE layer has a CTE less than a CTE of silicon. The method 20 continues with block 26, in which the first silicon substrate is bonded to a second silicon substrate. The bonding is done in a manner so that the low CTE layer is bonded between the first and second substrates. The second silicon substrate has a silicon (100) surface. The method 20 continues with block 28 in which the first silicon substrate is thinned from the second side in a manner so that the thinned first silicon substrate is substantially thinner than the second silicon substrate. The method 20 continues with block 30 in which a buffer layer is formed over the second side of the thinned first silicon substrate. The buffer layer has a CTE greater than the CTE of silicon. The method 20 continues with block 32 in which a gallium nitride layer is grown over the buffer layer by an epitaxial process. The gallium nitride layer has a CTE greater than the CTE of the buffer layer (and thus a CTE greater than the CTE of silicon).

FIGS. 2 to 7 are diagrammatic fragmentary cross-sectional side views of a semiconductor device at various fabrication stages according to embodiments of the method 20 of FIG. 1. It is understood that FIGS. 2 to 7 have been simplified for a better understanding of the inventive concepts of the present disclosure.

Figure 2:
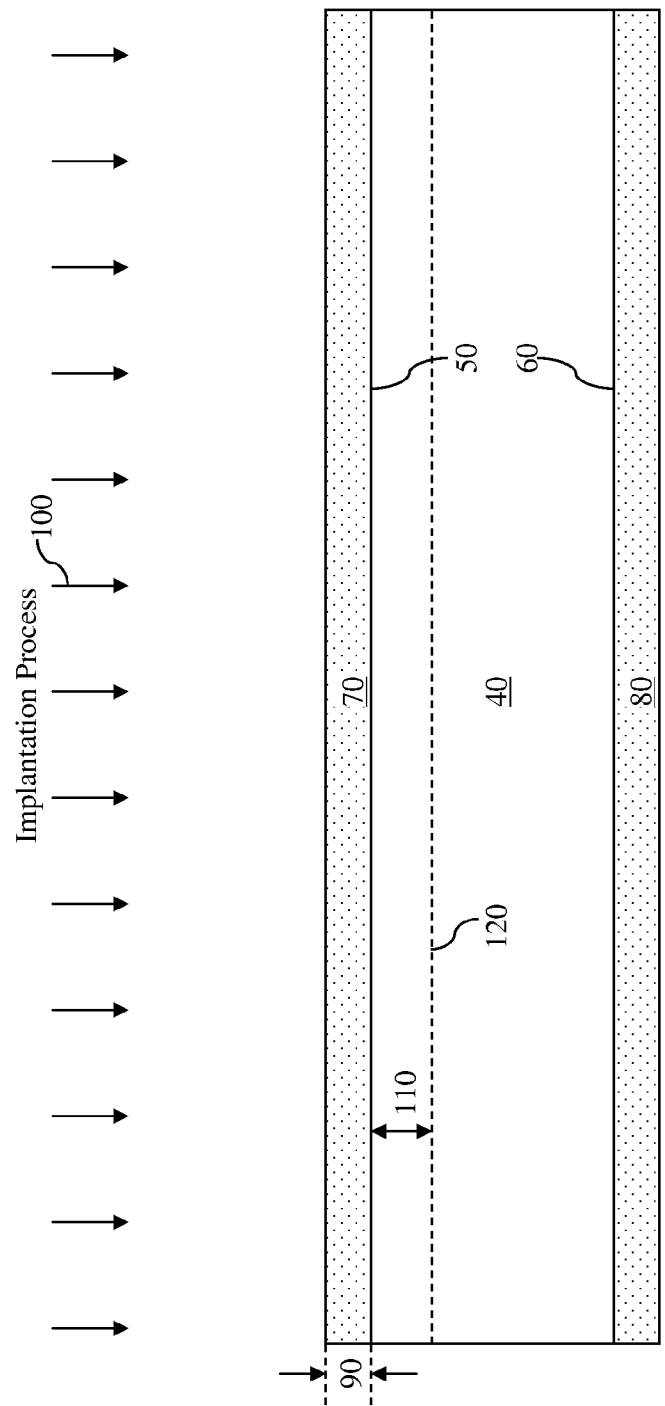
FIGS. 2-7 are diagrammatic fragmentary cross-sectional side views of a portion of a wafer at various stages of fabrication in accordance with various aspects of the present disclosure.

Referring to FIG. 2, a silicon wafer 40 is provided. The silicon wafer 40 may also be referred to as a silicon substrate 40. The silicon wafer 40 has a side or a surface 50, and a side or a surface 60 that is located opposite the side 50. The side 50 and side 60 each have a silicon (111) surface. The silicon (111) surface is obtained by cleaving or cutting the silicon along a (111) lattice plane defined according to a Miller Index. In an embodiment, the silicon wafer 40 has a lattice constant that is in a range from about 3.8 angstroms to about 3.9 angstroms, and a coefficient-of-thermal-expansion (CTE) that is in a range from about $2.5 \times 10^{-6}/°$ C. to about $2.7 \times 10^{-6}/°$ C. It is understood that all the lattice constants discussed in this disclosure are measured at about 300 degrees Kelvin.

A low CTE layer 70 is formed on the side 50 of the silicon wafer 40, and a low CTE layer 80 is formed on the side 60 of the silicon wafer 40. The low CTE layers 70 and 80 each have a CTE that is lower than a CTE of silicon (which is close to $3 \times 10^{-6}/°$ C.). In an embodiment, the low CTE layers 70 and 80 each have a CTE that is lower than about $1 \times 10^{-6}/°$ C. Here, the low CTE layers 70 and 80 each include a silicon oxide material and are formed by a thermal oxidation process known in the art. The silicon oxide material has a CTE that is about $0.55 \times 10^{-6}/°$ C. In other embodiments, the low CTE layers 70 and 80 may be formed by a plasma-enhanced chemical vapor deposition (PECVD) process or a low-pressure chemical vapor deposition (LPCVD) process known in the art.

The low CTE layer 70 has a thickness 90. In an embodiment, the thickness 90 is less than about 2 microns, for example in a range from about 1 micron (um) to about 2 um. The thickness 90 is not randomly chosen, but is rather calculated by a set of equations to be discussed later. The thickness 90 is calculated to have an optimized value, such that the low CTE layer can generate a compressive stress to counteract or balance against a tensile stress generated by a gallium nitride layer discussed later. In general, stress is a measure of internal forces acting within a deformable body. The compressive stress involves a force acting inward to a plane, whereas the tensile stress involves a force acting outward from the plane.

An implantation process 100 is performed to the low CTE layer 70 and the silicon wafer 40 through the side 50. The implantation process 100 uses hydrogen as a dopant. The implantation process 100 also has an implantation energy that is in a range from about 50 kilo-electron-volts (KeV) to about 300 KeV, and an implantation dose that is in a range from about $1 \times 10^{16}/cm^2$ to about $1 \times 10^{17}/cm^2$. After the implantation process 100 is performed, the hydrogen dopant can reach an implant depth 110, where the implant depth 110 is measured from the side 50 of the silicon wafer 40. A broken line 120 is shown in FIG. 2, approximately designating where the implant penetration ends. Thus, the broken line 120 may also be referred to as an implant depth line 120.

The amount of implant depth 110 of the dopant penetration in the silicon wafer 40 is correlated to the implantation energy used in the implantation process 100. A greater implantation energy will result in a deeper implant depth 110. Here, only a relatively shallow portion of the silicon wafer 40 is implanted by hydrogen, and a majority of the silicon wafer 40 is not implanted. In an embodiment, the implant depth 110 is in a range from about 1 um to about 2 um.

Figure 3:
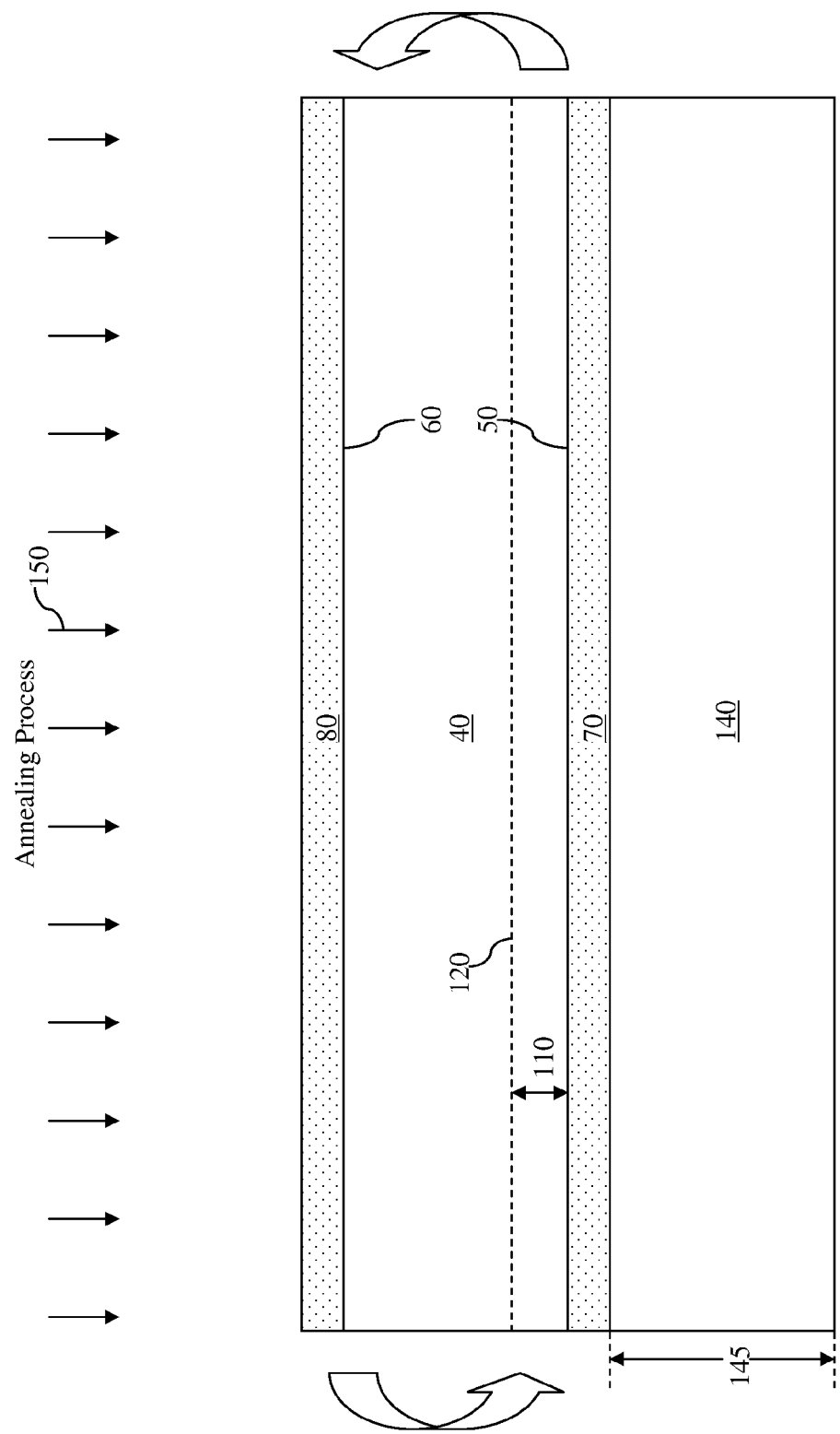

Referring to FIG. 3, the silicon wafer 40 (as well as the low CTE layers 70 and 80) are vertically flipped (or flipped upside down). Thus, in FIG. 3, the side 50 is shown below the side 60. Therefore, the side may now be referred to as a back side 50, and the side 60 may now be referred to as a front side 60.

The silicon wafer 40 is then bonded to a silicon wafer 140. Unlike the silicon wafer 40, the silicon wafer 140 has top and bottom surfaces that are silicon (100) surfaces. The silicon (100) surface is obtained by cleaving or cutting the silicon along a (100) lattice plane defined according to the Miller Index. The bonding between the silicon wafers 40 and 140 may be carried out using a direct bonding process or an optical fusion bonding process. Alternatively, the silicon wafers 40 and 140 may be bonded together by techniques such as metal diffusion or anodic bonding known in the art.

In an embodiment, the silicon wafer 140 has a lattice constant that is in a range from about 1000 angstroms to about 200,000 angstroms, and a coefficient-of-thermal-expansion (CTE) that is in a range from about $0.3 \times 10^{-6}/°C$ to about $1.5 \times 10^{-6}/°C$. The silicon wafer 140 also has a thickness 145. The thickness 145 is substantially greater than the implant depth 110. In an embodiment, a ratio of the thickness 145 to the implant depth 110 is greater than about 10:1. In another embodiment, a ratio of the thickness 145 to the implant depth 110 is greater than about 150:1. For example, in the embodiment where the implant depth 110 is within a range from about 1 um to 2 um, the thickness 145 of the silicon wafer 140 is in a range from about 500 um to 1000 um.

An annealing process 150 is then performed on the silicon wafers 40 and 140 and the low CTE layers 70 and 80. In one embodiment, the annealing process 150 is performed at a temperature range from about 400 degrees Celsius to about 500 degrees Celsius, and for a process time duration (also referred to as split annealing time) in a range from about 15 minutes to about 60 minutes. The annealing process 150 facilitates a reaction between the implanted hydrogen and the silicon material in the silicon wafer 40. As a result, "bubbles" (which are products of hydrogen and silicon) will form roughly along the implant depth line 120.

Figure 4:
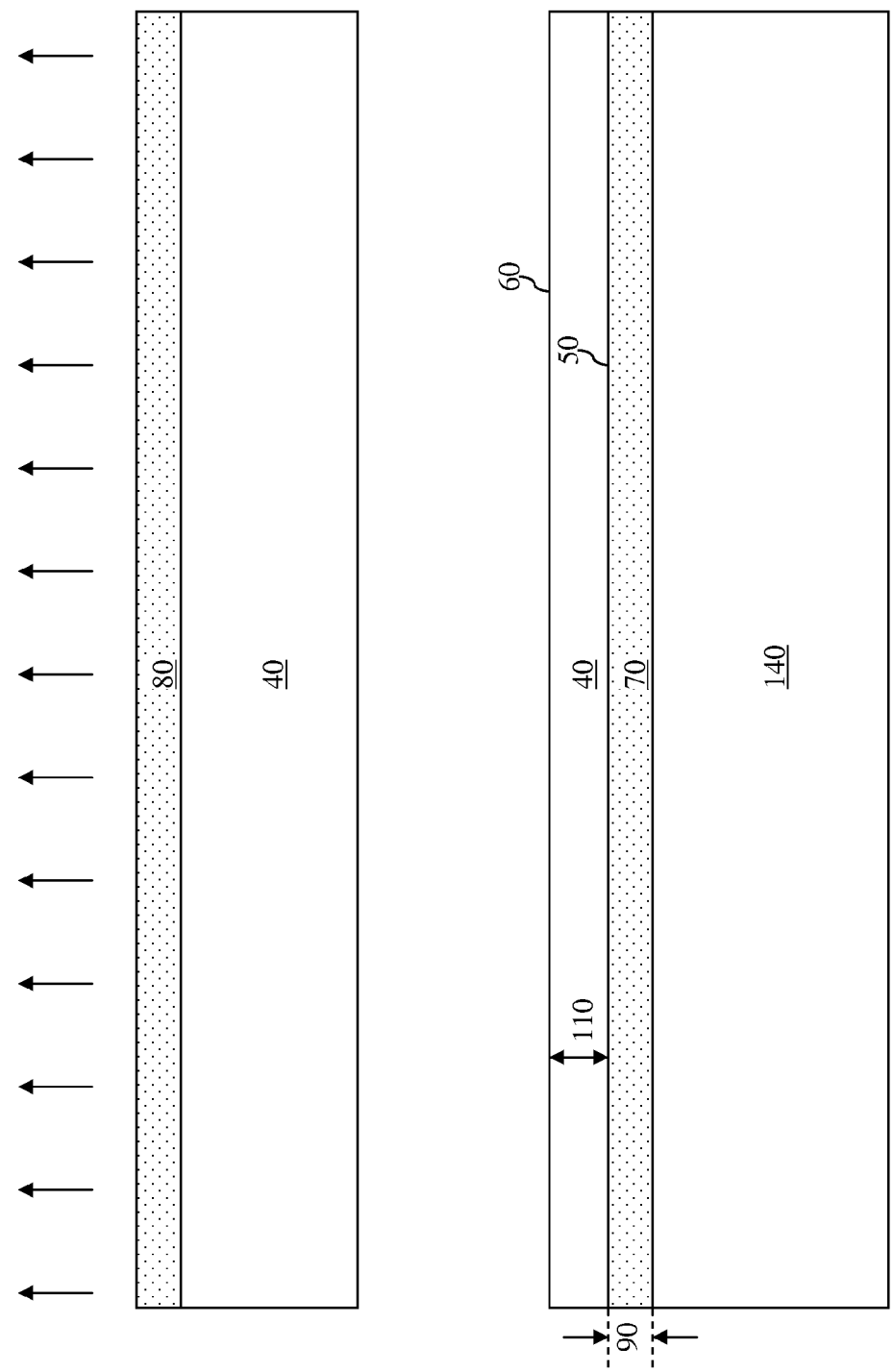

Referring now to FIG. 4, the silicon wafer 40 is cooled to approximately room temperature, which in an embodiment is in a range from about 20 degrees Celsius to about 30 degrees Celsius. The low CTE layer 80 and a portion of the silicon wafer 40 located above the implant depth line 120 are then removed. This may be carried out using a splitting process (also referred to as a cutting or thinning process), in which a "water knife" or a mechanical tool (such as a saw) can be used to cut or otherwise sever the silicon wafer 40 along the implant depth line 120.

The bubbles formed along the implant depth line 120 make the cutting easy. Using an analogy to illustrate, post stamps can be easily separated from one another due to the plurality of holes punched in between the adjacent stamps. When the stamps are torn, the tear lines follow the lines of the punched holes, because those punched holes are the mechanically weaker regions. In a similar fashion, the presence of the bubbles leads to mechanical weakness along the implant depth line 120, thereby making cutting easy along that line.

After the splitting, a remaining portion of the silicon wafer 40 has a thickness that is approximately equal to the implant depth 110. Since the amount of implant depth 110 depends on the implantation energy of the implantation process 100 (higher energy, deeper implant depth 110), it can be seen now that the implantation energy of the implantation process 100 can be tuned to control the desired thickness of the remaining portion of the silicon wafer 40.

At this point, the bottom side 60 (which is now the exposed upper surface in FIG. 4) of the silicon wafer 40 is planarized to form a smooth surface. The planarization may be done using a chemical mechanical polishing (CMP) process or another suitable technique known in the art. It is understood that since the implant depth 110 is relatively shallow, the splitting process causes a substantial majority portion of the silicon wafer 40 to be removed. Such removal may cause very slight bending of the remaining portion of the silicon wafer 40. The amount bending of the silicon wafer 40 at this stage is negligible, and is therefore not illustrated in FIG. 4 for the sake of simplicity.

Figure 5:
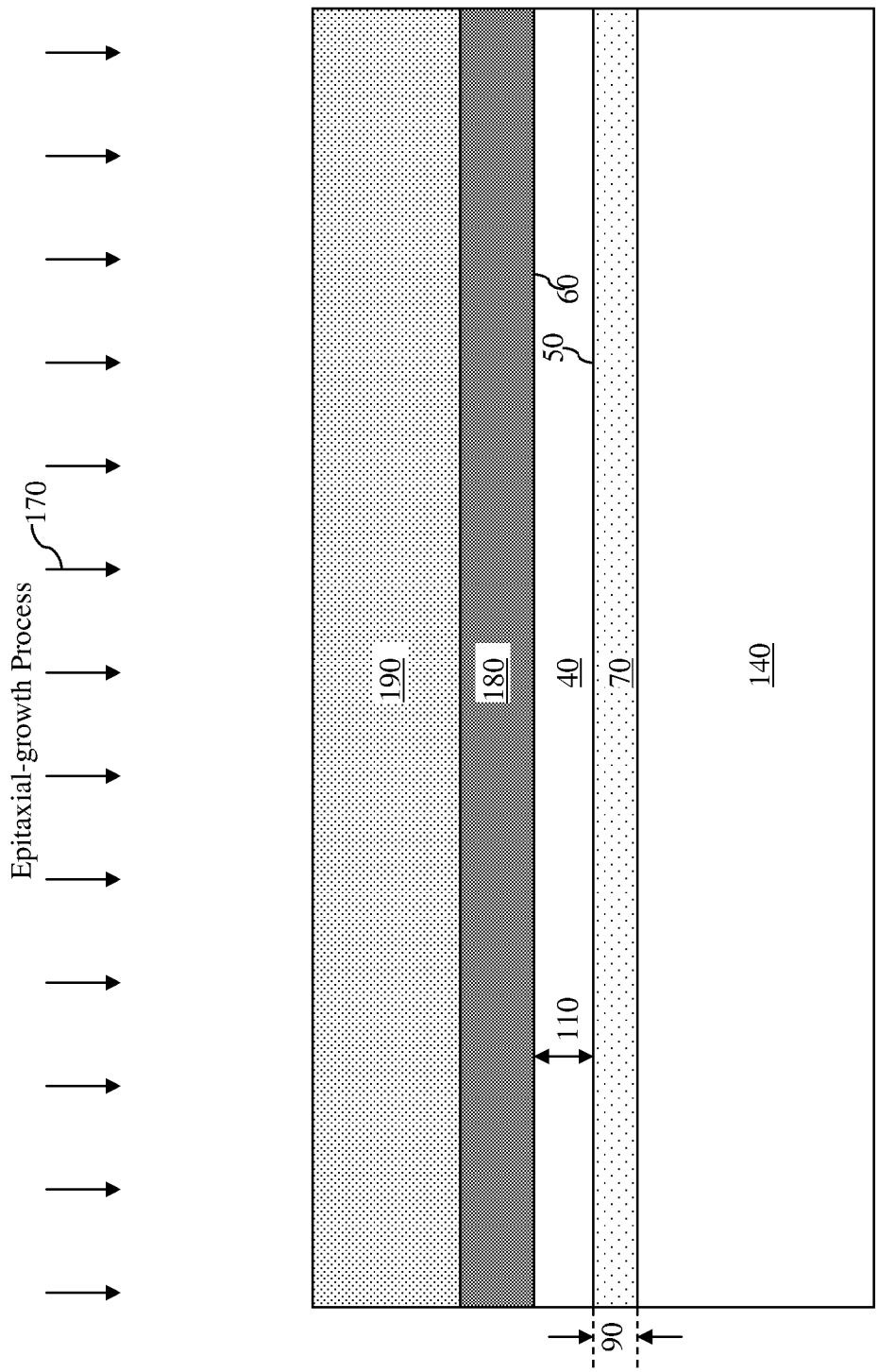

Referring now to FIG. 5, one or more epitaxial-growth processes 170 (also referred to as epi processes or epi-growth processes) may be performed to form a buffer layer 180 on the front side 60 of the silicon wafer 40, and a gallium nitride layer 190 on the buffer layer 180. The epitaxial processes 170 are performed under high temperatures. In one embodiment, the high temperatures range from about 800 degrees Celsius to about 1400 degrees Celsius. The process time duration (also referred to as epi-growth time) is at a range from about 3 hours to about 5 hours.

The buffer layer 180 may include a plurality of thin layers of aluminum nitride or aluminum gallium nitride. These thin layers of aluminum nitride or aluminum gallium nitride may each be as thin as a few nanometers (nm) or tens of nanometers. In one embodiment, the buffer layer 180 is implemented as a low temperature aluminum nitride structure, in which a plurality of aluminum nitride layers as thin as a few nanometers are interlaced with a plurality of gallium nitride layers as thin as a few hundred nanometers. In another embodiment, the buffer layer 180 is implemented as a super-lattice structure, in which a gallium nitride/aluminum nitride super-lattice is formed at high temperatures, for example temperatures as high as about 1050 degrees Celsius. In yet another embodiment, the buffer layer is implemented as a step graded aluminum gallium nitride structure. In an embodiment, the step graded aluminum gallium nitride structure includes aluminum nitride layers, a graded aluminum gallium nitride layer, and a fixed aluminum gallium nitride layer. These layers may be formed at different temperatures. It is understood that the buffer layer 180 is not limited to the structures discussed above, and may be implemented differently in other embodiments.

The gallium nitride layer 190 may also be referred to as a III-V family or a III-V structure, because gallium is in the "III" family of the periodic table, and nitrogen is in the "V"

family of the periodic table. A gallium nitride material may have a lattice constant that is in a range from about 3 to 3.4 and a CTE that is in a range from about $5.1 \times 10^{-6}/°$ C. to about $6.1 \times 10^{-6}/°$ C. An aluminum nitride material may have a lattice constant that is in a range from about 2.9 to about 3.3 and a CTE that is in a range from about $3.8 \times 10^{-6}/°$ C. to about $4.5 \times 10^{-6}/°$ C. The lattice constant and the CTE of an aluminum gallium nitride material is close to those of the aluminum nitride. Since the buffer layer 180 includes aluminum nitride and/or aluminum gallium nitride, the buffer layer 180 has a slightly lower lattice constant and a slightly lower CTE than the gallium nitride layer 190.

The silicon wafer 40 is chosen to have the silicon (111) surface so that its lattice constant is better matched with that of the gallium nitride layer 190 (and of the buffer layer 180), in comparison with the silicon (100) surface. By using the silicon wafer with the silicon (111) surface, and by adjusting the implementation scheme of the buffer layer 180, different lattice constant mismatches may be achieved at a surface interface between the gallium nitride layer 190 and the buffer layer 180, as well as at the buffer layer 180 and the silicon wafer 40. Here, the lattice constant mismatches may be adjusted in a manner such that the entire device—including the silicon wafers 40 and 140 and the layers 70, 180, and 190—remains substantially flat at the high temperature range from about 800 degrees Celsius to about 1400 degrees Celsius. This is done in part due to the stresses created by the lattice constant mismatches balancing each other out. In an embodiment, the entire device under the above high temperature has a distortion that is less than about 25 um. The distortion may also be referred to as wafer bowing or wafer warping.

Although not illustrated for reasons of simplicity, it is understood that a cladding layer may be formed over the gallium nitride layer 190 to enhance its electrical properties.

Figure 6:
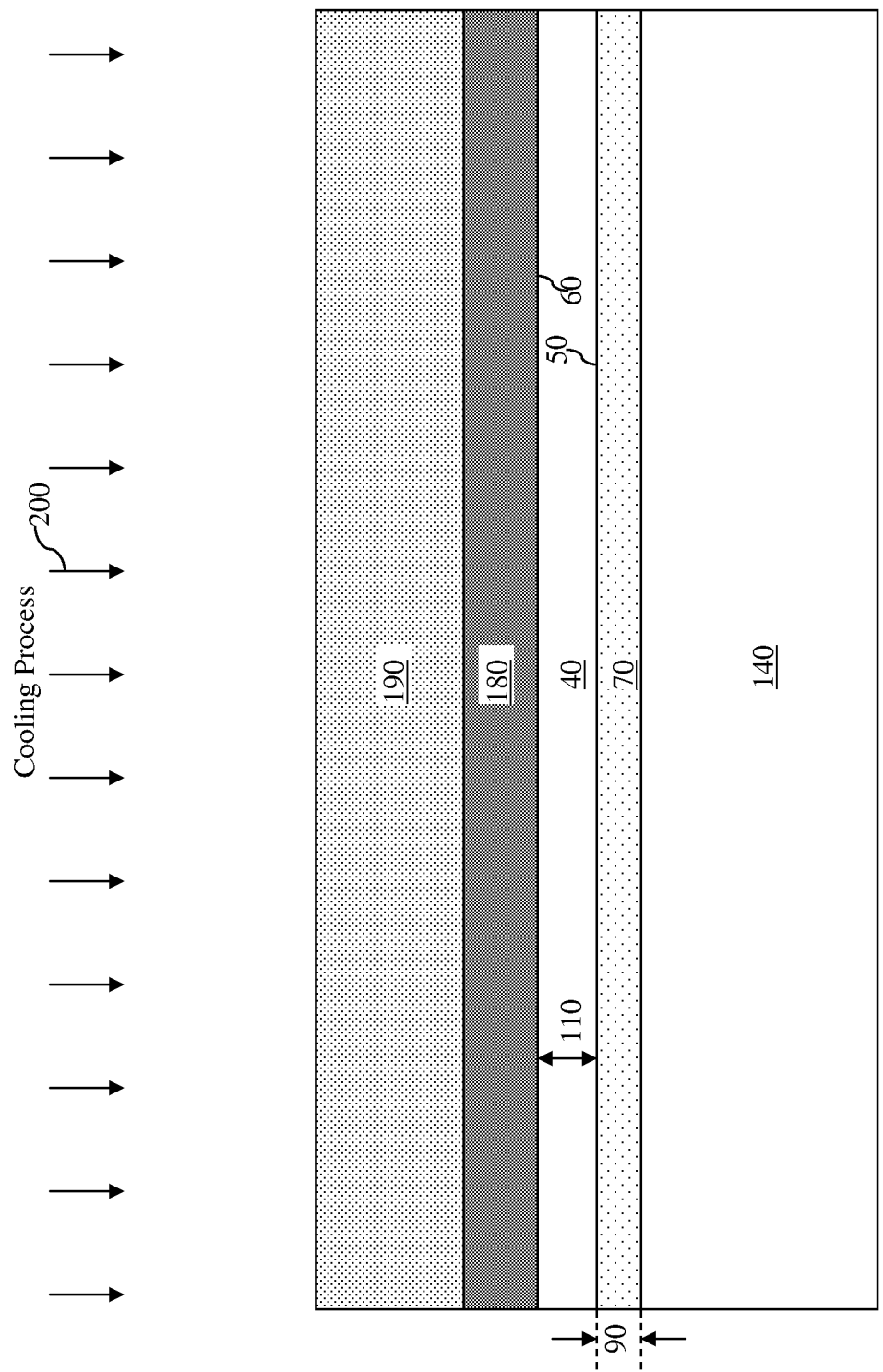

Referring now to FIG. 6, a cooling process 200 is performed to the entire device. The cooling process 200 cools the temperature for the entire device down to a room temperature range, for example a range from about 20 degrees Celsius to about 30 degrees Celsius. As the entire device is being cooled, the various layers contract according to their respective CTEs. A layer with a greater CTE contracts more than a layer with a lower CTE. The different rates of contraction will cause stress between adjacent layers. The amount of stress is also dependent on the thickness of the layers. For example, as a layer becomes thicker, its contribution to the amount of stress will increase accordingly. If a layer is too thin—substantially thinner than its neighboring layer(s)—then the amount of stress contribution due to that thing layer is negligible and may be omitted in performing stress calculations.

Here, the silicon wafer 40 (after being split or thinned) is substantially thinner than the silicon wafer 140. Therefore, the silicon wafer 40 may be negligible in performing stress calculations. Also, since the material composition of the buffer layer 180 is similar to that of the gallium nitride layer 190, and their CTEs are not too different, the buffer layer 180 and the gallium nitride layer 190 may roughly be viewed as a collective entity in performing stress calculations as well.

The low CTE layer 70 has a lower CTE than both the silicon wafer 140 and the buffer layer 180/gallium nitride layer 190. As cooling occurs, the cooling makes the buffer layer 180/gallium nitride layer 190 contract more than the low CTE layer 70, which also creates tensile stress at the interface between the low CTE layer 70 and the buffer layer 180/gallium nitride layer 190. Meanwhile, the silicon wafer 140 contracts more than the low CTE layer 70, which creates compressive stress at the interface between the silicon wafer 140 and the low CTE layer 70. These two interfaces are on opposite sides/surfaces of the low CTE layer 70 (e.g., top and bottom sides/surfaces), so the stresses at the two interfaces counteract against each other. The stress contribution due to the silicon wafer 40 can be ignored, since it is so thin.

In an embodiment, the thickness 90 of the low CTE layer 70 is calculated so that the stresses at the two opposite interfaces will substantially balance each other out as the overall device is cooled to the room temperature range. Even if the balancing isn't 100%, the remaining amount of stress can be easily absorbed by the silicon wafer 140 without causing damage, because the silicon wafer 140 is so much thicker than all the other layers. In this manner, the low CTE layer 70 help reduce distortion to the overall device by generating the compressive stress to at least partially cancel out the tensile stress generated by the gallium nitride layer 190. Had the low CTE layer 70 not been inserted, the tensile stress due to the gallium nitride layer 190 would have distorted or warped the shape of the overall device, including the silicon wafer 140 and the gallium nitride layer 190. But since the stresses are substantially balanced here, the overall device remains substantially flat before and after the cooling process 200.

The following equations provide more mathematical details to the stress calculations discussed above:

$$\sigma(E_i', R_i, d_i) = \sigma_1 + \sigma_2 + \sigma_3$$

$$\sigma_1 = -\frac{E_1' d_1^2}{6}\left(\frac{1}{R_2} - \frac{1}{R_1}\right) + \frac{E_1' Y_1}{R_2}$$

$$\sigma_2 = -\frac{E_1' d_1^2}{6 d_2}\left(\frac{1}{R_2} - \frac{1}{R_1}\right)$$

$$\sigma_3 = \frac{E_1' d_1^2}{6 d_3}\left(\frac{1}{R_3} - \frac{1}{R_2}\right)$$

$$E_i' = \frac{E_i}{1 - v_i}$$

where σ is the stress of a layer, d is the thickness of a layer, E is the stress coefficient of a layer, R is the curvature of a layer, and v is the poisson's ratio of a layer. The subscripts 1, 2, and 3 refer the silicon wafer 140, the low CTE layer 70, and the combination of the buffer layer 180 and the gallium nitride layer 190 collectively. Also, E' refers to the stress coefficient of the remaining silicon wafer 40. E' is included in the calculations if more precision is desired, and can be omitted from the calculations if only an approximation is needed.

Based on the above set of equations, the thickness 90 (appearing as $d_2$ in the equations) of the low CTE layer 70 can be calculated so that the overall device has a distortion that is less than about 25 um. For example, the sum of the stresses ($\sigma_1$, $\sigma_2$, and $\sigma_3$) may be set to 0, and $d_2$ can be calculated accordingly by manipulating the above equations. In one embodiment, $d_2$ (or the thickness 90) is calculated to be less than about 2 um, for example within a range from about 1 um to about 2 um.

From the discussions above, it can be seen that the present disclosure offers a method to form a gallium nitride material on a silicon wafer, without causing distortion to the wafer. This method can be applied in different fields of semiconductor technologies that may involve gallium nitride growth on a substrate. For example, it can be used to fabricate high power semiconductor devices, an example of which is shown in FIG. 7.

Figure 7:
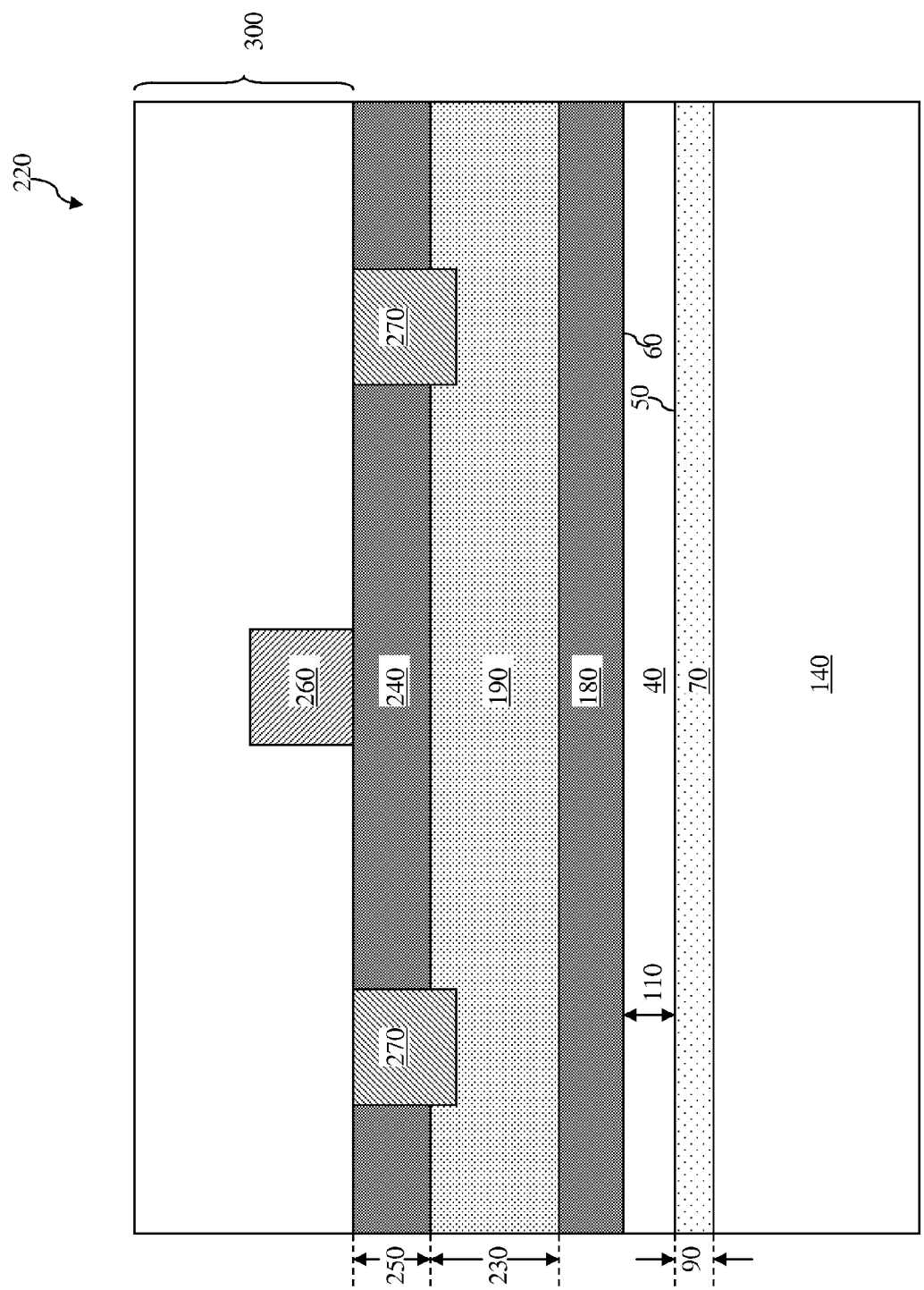

Referring to FIG. 7, a diagrammatic fragmentary cross-sectional side view of a high power semiconductor device 220 is illustrated. The semiconductor device 220 includes the silicon wafer 140, which is used in part to provide mechanical support for the layers formed thereon. The semiconductor device 220 includes the low CTE layer 70 for stress balancing purposes. The semiconductor device 220 also includes the silicon wafer 40, the buffer layer 180, and the gallium nitride layer 190. The gallium nitride layer 190 has a thickness 230. In an embodiment, the thickness 230 is in a range from about 1 um to about 4 um.

The high power semiconductor device 220 also includes an aluminum gallium nitride layer 240 that is formed over the gallium nitride layer 190. The aluminum gallium nitride layer 240 has a chemical formula $Al_xGa_{1-x}N$, where x is in a range from about 0.25 to 0.3. The aluminum gallium nitride layer 240 has a thickness 250. In an embodiment, the thickness 250 is in a range from about 10 nm to about 40 nm.

The high power semiconductor device 220 also includes a transistor formed by a gate device 260 and source/drain regions 270. The gate device 260 (or gate structure) is formed over the aluminum gallium nitride layer 240, and source/drain regions 270 are formed in the aluminum gallium nitride layer 240 and partially in the gallium nitride layer 190. The gate device 260 may include a gate dielectric component and a gate electrode component. The source/drain regions 270 may be formed by one or more doping or implantation processes. When the transistor device is turned on, a conductive channel is formed below the gate device 260 and between the source/drain regions 270. An electrical current will flow in the conductive channel.

The high power semiconductor device 220 also includes an interconnect structure 300 formed over the aluminum gallium nitride layer 240. The interconnect structure 300 includes a plurality of interconnect layers, also referred to as metal layers. Each metal layer contains a plurality of metal lines that route electrical signals. The metal layers are interconnected together by vias. Contacts are also formed over the gate device 260 and the source/drain regions 270 so that connections may be established with external devices. For the sake of simplicity, these metal lines, vias and contacts are not specifically illustrated in FIG. 7. Also, additional fabrication processes may be performed to finish the fabrication of the high power device 220, such as passivation, testing, and packaging processes. These processes are also not shown or discussed herein for reasons of simplicity.

It is understood that the high power device 220 illustrated in FIG. 7 and discussed above are provided merely to provide an example of how the low CTE layer 70 may be used to facilitate forming a gallium nitride layer on a silicon wafer. In other embodiments, the low CTE layer 70 may be used to form light-emitting diode (LED) devices, radio-frequency (RF) devices, and high electron mobility transistor (HEMT) devices. In fact, as long as it is desirable to form a III-V family layer on a silicon substrate without substantial distortion, the method and structure disclosed by the present disclosure may be applied.

The embodiments of the present disclosure discussed above offer advantages over existing methods. It is understood, however, that other embodiments may offer different advantages, and that no particular advantage is required for any embodiment. One of the advantages is that the overall device will remain substantially flat during fabrication, which helps reduce wafer defects. In traditional fabrication processes, the wafer may become distorted at one stage or another, even if the final wafer is flat. This is undesirable because the distortion or warping of the wafer will lead to wafer defects, thus reducing yield and/or degrading device performing and quality.

In comparison, the embodiments discussed above utilize the low CTE layer 70 to help ensure the wafer remains flat during fabrication. When the buffer layer 180 and the gallium nitride layer 190 are formed during the epitaxial-growth process 170 at the high temperature range of about 800 degrees Celsius to about 1400 degrees Celsius, the lattice constants of the respective layers are tuned such that the stresses are substantially balanced, thereby resulting in a substantially flat overall device. When the overall device is cooled to a room temperature from the high epitaxial growth temperatures, the low CTE layer 70 helps counteract stresses created as a result of different CTEs and different contraction rates. The thickness 90 of the low CTE layer 70 may be calculated and implemented so that the stresses are still balanced even as the overall device is cooled. Hence, the overall device remains substantially flat before and after the cooling process, and therefore defects related to wafer distortion may be reduced.

Another advantage is that the low CTE layer 70 is inexpensive to form, and its fabrication is compatible with existing fabrication process flow. Therefore, the insertion of the low CTE layer between the silicon wafer and the gallium nitride layer has minimal impact on fabrication costs.

One of the broader forms of the present disclosure involves a method. The method includes forming a first layer on a first side of a first wafer. The first wafer has a second side opposite the first side. The first layer has a coefficient-of-thermal-expansion (CTE) that is lower than that of silicon. The method also includes bonding the first wafer to a second wafer in a manner so that the first layer is disposed in between the first and second wafers. The method also includes removing a portion of the first wafer from the second side. The method also includes forming a second layer over the second side of the first wafer. The second layer has a CTE higher than that of silicon.

Another of the broader forms of the present disclosure involves a method of fabricating a semiconductor device. The method includes: providing a first silicon substrate having opposite first and second sides. at least one of the first and second sides includes a silicon (111) surface. The method also includes forming a low coefficient-of-thermal-expansion (CTE) layer on the first side of the first silicon substrate. The low CTE layer has a CTE less than a CTE of silicon. The method also includes bonding the first silicon substrate to a second silicon substrate in a manner so that the low CTE layer is bonded between the first and second silicon substrates. The second silicon substrate has a silicon (100) surface. The method also includes thinning the first silicon substrate from the second side in a manner so that the thinned first silicon substrate is substantially thinner than the second silicon substrate. The method also includes forming a buffer layer over the second side of the thinned first silicon substrate. The buffer layer has a CTE greater than the CTE of silicon. The method also includes epi-growing a III-V family layer over the buffer layer. The III-V family layer has a CTE greater than the CTE of the buffer layer.

Still another of the broader forms of the present disclosure involves a semiconductor device. The semiconductor device includes a silicon substrate. The semiconductor device includes a first layer disposed over the silicon substrate. The first layer has a coefficient-of-thermal-expansion (CTE) lower than that of silicon. The semiconductor device includes a second layer disposed over the first layer. The second layer has a CTE that is approximately equal to that of silicon. The second layer is multiple times thinner than the silicon substrate. The semiconductor device includes a third layer disposed over the second layer. The third layer has a CTE that is greater than that of silicon.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a first layer on a first side of a first wafer, the first wafer having a second side opposite the first side, the first layer having a first coefficient-of-thermal-expansion (CTE), wherein forming the first layer on the first side includes forming the first layer on a first silicon (111) surface on the first side of the first wafer;
    forming a third layer on the second side of the first wafer, the third layer having a third CTE), wherein forming the third layer on the second side includes forming the third layer on a second silicon (111) surface on the second side of the first wafer;
    after forming a third layer, bonding the first wafer to a silicon (100) surface of a second wafer in a manner so that the first layer is disposed in between the first and second wafers, wherein the silicon (100) surface interfaces with the first layer at a first interface;
    removing a portion of the first wafer from the second side;
    thereafter forming a second layer over the second side of the first wafer, the second layer having a second CTE higher than the first CTE; and
    after forming the second layer, cooling the second layer, the first layer, and the first and second wafers to about a room temperature, wherein the cooling causes the second layer to contract more than the first layer which creates a tensile stress at a second interface between the first layer and the second layer, wherein the cooling causes the second wafer having the silicon (100) surface to contract more than the first layer which creates a compressive stress at the first interface between the silicon (100) surface of the second wafer and the first layer, and wherein the tensile stress at the second interface and the compressive stress at the first interface substantially balance each other out during the cooling such that the first wafer, first layer, second layer, third layer, and second wafer are substantially flat after the cooling.

2. The method of claim 1, wherein the forming the second layer is carried out using an epitaxial process, the epitaxial process having a process temperature range from about 800 degrees Celsius to about 1400 degrees Celsius;
    and wherein the room temperature includes a temperature range from about 20 degrees Celsius to about 30 degrees Celsius.

3. The method of claim 1, wherein the forming the second layer is carried out in a manner so that the second layer includes a material from the III-V family.

4. The method of claim 1, further including: before the forming the second layer, forming a buffer layer over the second side of the first wafer, the buffer layer having a CTE higher than the first CTE but lower than the second CTE;
    and wherein the second layer is formed on the buffer layer.

5. The method of claim 1, wherein:
    the forming the first layer is carried out in a manner so that the first CTE is less than a CTE of silicon; and
    the forming the second layer is carried out in a manner so that the second CTE is greater than the CTE of silicon.

6. The method of claim 1, wherein:
    the forming the first layer is carried out in a manner so that the first layer includes silicon oxide; and
    the forming the second layer is carried out in a manner so that the second layer includes gallium nitride.

7. The method of claim 1, further including:
    before the bonding, implanting hydrogen into the first layer and the first wafer; and
    after the bonding and before the removing, annealing the first layer and the first and second wafers;
    wherein the removing is carried out in a manner so that the first wafer has a first thickness after the removing, and the second wafer has a second thickness, and wherein a ratio of the second thickness to the first thickness is greater than about 150:1.

8. A method of fabricating a semiconductor device, comprising:
    providing a first silicon substrate having opposite first and second sides, the first and second sides including a first silicon (111) surface and a second silicon (111) surface, respectively;
    forming a low coefficient-of-thermal-expansion (CTE) layer on the first silicon (111) surface of the first silicon substrate, the low CTE layer having a CTE less than a CTE of silicon;
    forming another low CTE layer on the second silicon (111) surface of the first silicon substrate, the another low CTE layer having a CTE less than the CTE of silicon;
    bonding the first silicon substrate to a second silicon substrate in a manner so that the low CTE layer is bonded between the first and second silicon substrates, the second silicon substrate having a silicon (100) surface interfacing with the low CTE layer at a first interface;
    thinning the first silicon substrate from the second side in a manner so that the thinned first silicon substrate is substantially thinner than the second silicon substrate;
    forming a buffer layer over the second side of the thinned first silicon substrate, the buffer layer having a CTE greater than the CTE of silicon;
    epi-growing a III-V family layer over the buffer layer, the III-V family layer having a CTE greater than the CTE of the buffer layer; and
    after the epi-growing, cooling the III-V family layer, the buffer layer, the low CTE layer, and the first and second silicon substrates to about a room temperature, wherein the cooling causes the III-V family layer and the buffer layer to contract more than the low CTE layer which creates a tensile stress at a second interface between the low CTE layer and the III-V family layer and the buffer layer, wherein the cooling causes the second silicon substrate having the silicon (100) surface to contract more than the low CTE layer which creates a compressive stress at the first interface between the silicon (100) surface of the second silicon substrate and the low CTE layer, and wherein the tensile stress at the second interface and the compressive stress at the first interface substantially balance each other out during the cooling such that the semiconductor device remains substantially flat after the cooling.

9. The method of claim 8, wherein:
    the forming the low CTE layer is carried out in a manner so that the CTE of the low CTE layer is less than about $1 \times 10^{-6}/°$ C.; and
    the forming the buffer layer is carried out in a manner so that: the buffer layer includes a plurality of layers, and the CTE of the buffer layer is in a range from about 3.8×10$^{-6}$/° C. to about 4.5×10$^{-6}$/° C.

10. The method of claim 8, wherein:
the forming the low CTE layer is carried out in a manner so that the low CTE layer includes a silicon oxide material; and
the epi-growing the III-V family layer is carried out in a manner so that the III-V family layer includes a gallium nitride material.

11. The method of claim 8, wherein:
the thinning the first silicon substrate includes a severing process that severs away a majority of the first silicon substrate; and
the second silicon substrate is at least 150 times thicker than the thinned first silicon substrate.

12. The method of claim 8, wherein the epi-growing the III-V family layer is performed at a temperature range from about 800 degrees Celsius to about 1400 degrees Celsius.

13. The method of claim 8, further including:
before the bonding, implanting hydrogen into the low CTE layer and the first silicon substrate;
after the bonding and before the thinning, annealing the low CTE layer and the first and second silicon substrates; and
after the thinning, performing a chemical-mechanical-polishing process on the thinned first silicon substrate from the second side.

14. The method of claim 8, wherein the low CTE layer has a thickness in a range from about 1 micron to about 2 microns.

15. A semiconductor device, comprising:
a substrate having a first coefficient-of-thermal-expansion (CTE), the substrate having a silicon (100) surface;
a first layer having a second CTE disposed directly on the silicon (100) surface of the substrate such that the first layer interfaces with the silicon (100) surface at a first interface;
a thin substrate over the first layer, the thin substrate having a third CTE that is greater than the first CTE, the thin substrate having a silicon (111) surface interfacing with the first layer at a second interface; and
a second layer having a fourth CTE disposed over the thin substrate, wherein the fourth CTE is greater than the second CTE,
wherein a tensile stress at the second interface caused by the second layer is balanced out by a compressive stress at the first interface caused by the silicon (100) surface of the substrate such that the semiconductor device remains substantially flat.

16. The semiconductor device of claim 15, wherein:
the first layer includes a silicon oxide material and has a thickness that is in a range from about 0.5 microns to about 2 microns; and
the second layer includes a material from the III-V family.

17. The semiconductor device of claim 15, wherein:
the thin substrate is at least 150 times thinner than the substrate.

18. The semiconductor device of claim 15, further including a buffer layer disposed between the thin substrate and the second layer;
and wherein:
the buffer layer includes an aluminum nitride material; and
the second layer includes a gallium nitride material.

19. The method of claim 1, wherein removing the portion of the first wafer from the second side includes removing the third layer on the second side of the first wafer.

20. The method of claim 1, further comprising implanting hydrogen ions through the first layer into the first wafer at a first depth;
forming bubbles at the first depth by annealing the first wafer having the implanted hydrogen ions; and
cutting the first wafer at the first depth.

* * * * *